United States Patent
Haacke et al.

(10) Patent No.: US 6,501,272 B1
(45) Date of Patent: Dec. 31, 2002

(54) APPLICATION-SPECIFIC OPTIMIZATION OF ECHO TIME IN MR PULSE SEQUENCES FOR INVESTIGATING MATERIALS WITH SUSCEPTIBILITIES DIFFERENT FROM THAT OF THE BACKGROUND IN WHICH THEY ARE EMBEDDED

(75) Inventors: E. Mark Haacke, St. Louis, MO (US); Juergen Reichenbach, Jena (DE); Yi Wang, Maplewood, MO (US)

(73) Assignee: Magnetic Resonance Innovations, Inc., St. Louis, MO (US)

(*) Notice: Subject to any disclaimer, the term of this patent is extended or adjusted under 35 U.S.C. 154(b) by 0 days.

(21) Appl. No.: 09/098,651
(22) Filed: Jun. 17, 1998
(51) Int. Cl.[7] ................................................. G01V 3/00
(52) U.S. Cl. ........................................ 324/306; 324/309
(58) Field of Search .......................... 324/306, 309, 324/307, 311, 312; 128/664, 653.1, 653; 600/410

(56) References Cited

U.S. PATENT DOCUMENTS 4,609,872 A * 9/1986 O'Donnell ................ 324/306
5,204,625 A * 4/1993 Cline et al. ............... 324/306
5,213,105 A * 5/1993 Gratton et al. ............ 128/664
5,832,922 A * 11/1998 Schotland ................ 128/653.1

OTHER PUBLICATIONS

Ogawa et al Magnetic Resonance Imaging of Blood Vessels at High Fields: Magnetic Resonance in Medicine vol. 16, 9–18 (1990).*

* cited by examiner

Primary Examiner—Edward Lefkowitz
Assistant Examiner—Brij B. Shrivastav
(74) Attorney, Agent, or Firm—Mark H. Jay

(57) ABSTRACT

The echo time in an MR pulse sequence is optimized in accordance with the application desired. Advantageously, the echo time is selected to cause a partial volume signal cancellation from veins as compared with background tissue, and the MR pulse sequence is of a velocity-compensated type. MR data are acquired from gradient echoes. Multiple echoes may be used to extract information (such as volume content and susceptibility) about the material under investigation.

29 Claims, 7 Drawing Sheets mIP IMAGE (POST-CONTRAST)

a: WITHOUT PHASE MULTIPLICATION
b: WITH PHASE MULTIPLICATION mIP IMAGE

APPLICATION-SPECIFIC OPTIMIZATION OF ECHO TIME IN MR PULSE SEQUENCES FOR INVESTIGATING MATERIALS WITH SUSCEPTIBILITIES DIFFERENT FROM THAT OF THE BACKGROUND IN WHICH THEY ARE EMBEDDED

BACKGROUND OF THE INVENTION

The invention relates to magnetic resonance (MR) imaging, and more particularly relates to MR imaging of structures having varying magnetic susceptabilities. In its most immediate sense, the invention relates to MR imaging of veins in a living subject such as a human patient.

It has long been known that the magnetic susceptibility of blood varies with the state of oxygenation of the blood, and that de-oxygenated venous blood has a different magnetic susceptibility than oxygenated arterial blood. It has accordingly long been known that venous blood produces a smaller MR signal than arterial blood, and that this difference can be decreased by using an MR pulse sequence having a longer echo time. However, this phenomenon has not been utilized in MR imaging.

Furthermore, even though this relationship between magnetic susceptibility and blood oxygenation has long been known, it has not been used to evaluate the oxygenation of blood, nor to evaluate the total blood volume in a particular region of the body.

One aspect of the invention proceeds from a realization that by optimizing the echo time in an MR pulse sequence, it is possible to distinguish structures having different magnetic susceptabilities, which structures would otherwise look the same (or similar) in an MR image. More specifically, by using an echo time that is sufficiently long to cause different partial volume signal cancellations from the structures as compared with the background material in which they are embedded, it is possible to distinguish between them.

Another aspect of the invention proceeds from a realization that such optimization, when used in an MR pulse sequence of a velocity-compensated type, makes it possible for an MR study to distinguish veins from arteries and from surrounding tissue, and to quantify the oxygenation and volume of blood in the region of interest.

Hence, in accordance with one aspect of the invention, there is disclosed a method of MR imaging a region of interest containing at least two structures having different magnetic susceptibilities and a background material in which said structures are embedded. In accordance with the invention, an MR study of the region of interest is conducted using a MR pulse sequence in which the echo time is selected to cause different partial volume signal cancellations from the structures as compared with the background material, and MR data are acquired from gradient echoes produced by the MR study. From these data, each of the structures can be distinguished from the other, and from the background material.

In accordance with another aspect of the invention, which is specifically directed to an application in which veins are to be distinguished from tissue in which they are embedded, an MR study is conducted using a velocity-compensated MR pulse sequence. The echo time of the MR pulse sequence is selected to cause a partial volume signal cancellation from veins in the region of interest as compared with the background tissue in the region of interest. Then, MR data are acquired from gradient echoes produced by the MR study. From these data, the veins can be visualized.

In accordance with still another aspect of the invention, which is specifically directed to an application in which tissue-embedded veins and arteries are to be distinguished from each other and from the tissue in which they are embedded, an MR study is conducted using a velocity-compensated MR pulse sequence. The echo time of the MR pulse sequence is selected to cause a partial volume signal cancellation from veins in the region of interest as compared with arteries and background tissue in the region of interest. Then, MR data are acquired from gradient echoes produced by the MR study. From these MR data, an amplitude image and a phase image of the region of interest are formed, and the amplitude image is filtered by operating upon it with the phase image, thereby producing a filtered image.

The phase image is so constructed that it operates differently upon amplitude image data relating to veins and amplitude image data relating to arteries and background tissue. In this manner, veins and arteries are made more visually distinguishable.

In one advantageous embodiment, a minimum intensity projection or a maximum intensity projection or both are formed from the filtered image. The minimum intensity projection highlights veins; the maximum intensity projection highlights arteries.

In accordance with yet another aspect of the invention, oxygen saturation of blood and venous blood volume in a region of interest can be measured by conducting an MR study of the region of interest using a velocity-compensated multi-echo MR pulse sequence, acquiring MR data from gradient echoes produced by the MR study, and determining the oxygen saturation or venous blood volume from such data.

BRIEF DESCRIPTION OF THE DRAWINGS

The invention will be better understood with reference to the accompanying exemplary and non-limiting drawings, in which.

DETAILED DESCRIPTION OF PREFERRED EMBODIMENTS

Figure 1:
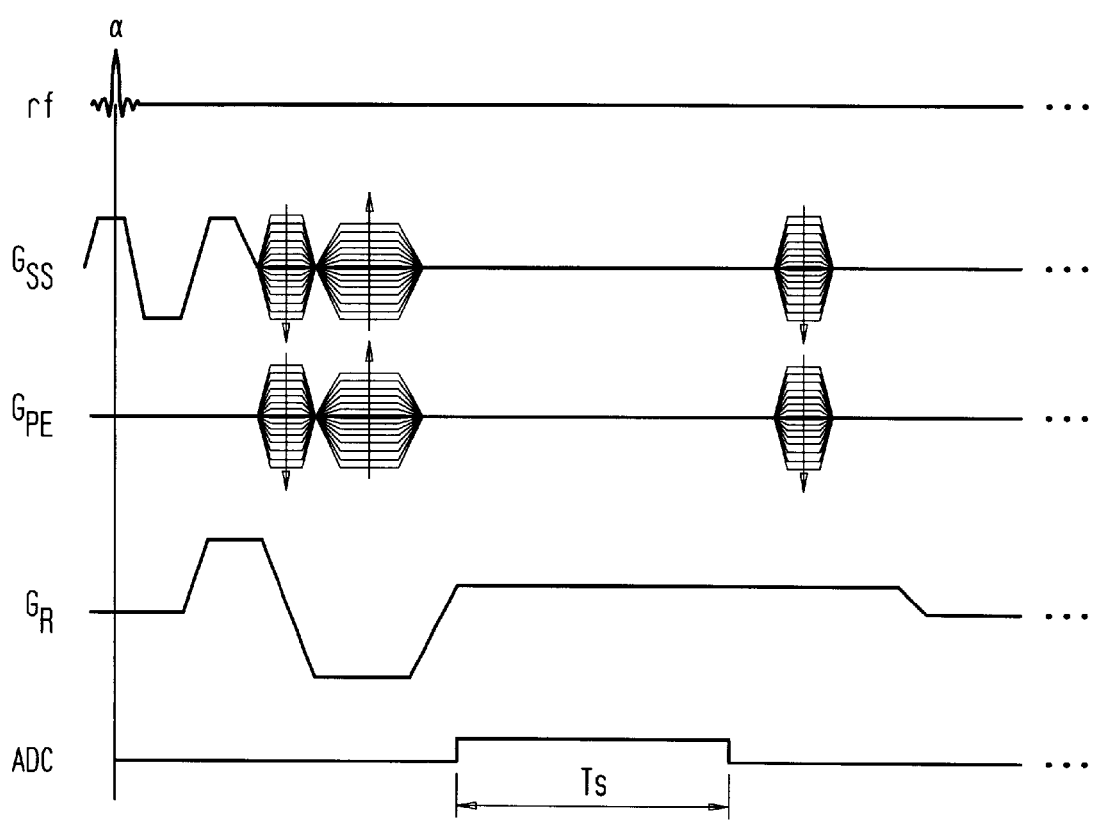
FIG. 1 shows a three-dimensional MR pulse sequence that may advantageously be used in accordance with the invention.

The following description will refer to blood and surrounding tissue because it is presently believed that this invention may find significant application in diagnostic medical imaging of living subjects and indeed human patients. However, it will be understood that this description is exemplary and that certain aspects of the present invention can be practiced using non-living things.

The presence of tissue having a different magnetic susceptibility than its surroundings (or "background") leads to a change in phase in this tissue relative to the background. If the change in field within the object is $\Delta B$ (along the same direction as the main magnetic field $B_o$) then the change in phase is $\gamma\Delta B TE$ (where $\gamma$=the gyromagnetic ratio of the material and TE=the echo time). (The actual value for $\Delta B$ will depend on the shape of the structure itself.)

Let it be assumed that the total signal S at a given pixel is being measured. The above-referenced change in phase will lead to a loss of signal at the remote pixel (this is referred to as a partial volume effect). The resulting complex signal is given by:

$$S_{total} = S_{background} + S_{blood} \exp(i - \gamma \Delta B TE) \quad (1)$$

where the subscripts denote the sources of the signal at the remote pixel. This means that if the phase of the blood varies from one background location to another, the variation will manifest itself as a loss of signal for the right choice of TE because of the complex vector sum inherent in Equation (1). This signal loss is quite different than the exponential loss caused by usual $T2^*$ relaxation. Rather, this signal loss is oscillatory and is over and above the conventional loss caused by $T2^*$ relaxation.

Phase changes vary because of changes in the magnetic susceptibility of tissue. (As mentioned above, the oxygenation of blood changes the magnetic susceptibility of the blood, so that venous blood has a different magnetic susceptibility than does arterial blood.) The change in the magnetic field at a remote pixel depends not only on this change in magnetic susceptibility but also on the shape of the object (in this example, the shape of the vessel in which the oxygenated or deoxygenated blood is contained). By way of example: a spherical volume of blood has no effect on far away tissue outside the sphere, but does change the magnetic field directly outside the spherical volume. If the sphere is smaller than a voxel within a region of interest there will still be a partial volume signal loss caused by external magnetic fields created by the blood. Inside a cylinder, on the other hand, the field change can be positive, zero, or negative. Specifically, for a cylinder, (and for the present purpose most vessels can be treated as if they were cylindrical), the change in phase inside the cylinder is given by $$\phi = -2\pi\gamma^* \Delta\chi_{do}^* B_o^* (1-Y)^* Hct^* (\cos^2 \theta - 1/3)^* TE \quad (2)$$

where $\Delta\chi_{do}$=0.18 ppm, (the susceptibility difference between fully deoxygenated blood and fully oxygenated blood), Hct is the hematocrit, Y is the oxygen saturation, and $\theta$ is the angle between the long axis of the cylinder and the main magnetic field. When $\theta$ is roughly 55°, the phase vanishes. At other angles, the phase is non-zero but does not reach a local maximum until either 0° or 180°. However, the change in phase outside the blood vessel is given by $$\phi = -2\pi\gamma^* \Delta\chi_{do}^* B_o^* (1-Y)^* Hct^* \cos(2\phi)^* \sin^2 \theta^* (a/r)^2 * TE \quad (3)$$

where $\theta$ is the angle made between the projections of the observation vector and the static field direction onto the plane cutting perpendicularly through the origin and the long axis of the cylinder, a is the radius of the cylinder and r is the distance from the center of the cylinder in the same plane as for the angle $\theta$ described above. It will therefore be evident that the field outside the cylinder can still cause a partial volume signal loss, even if the phase inside the cylinder is zero. As a specific example, if Y=0.5, Hct=0.4, $\chi_{do}$=0.18 ppm, $B_o$=1.5 T, $\theta$=0, and $\gamma/2\pi$=42.6 MHz/T, then $\theta=\pi$ when TE is chosen to be approximately 52 ms.

In accordance with the preferred embodiment of the invention as optimized for use in diagnostic medical imaging applications the MR data are collected with a fully velocity-compensated three-dimensional gradient echo sequence (see FIG. 1) so that the motion of the blood does not introduce artifacts into the reconstructed MR image. Advantageously, the slice select gradient is flow compensated, as are all three gradients for partition encoding, the phase encoding gradient, and the read gradient.

Figure 2:
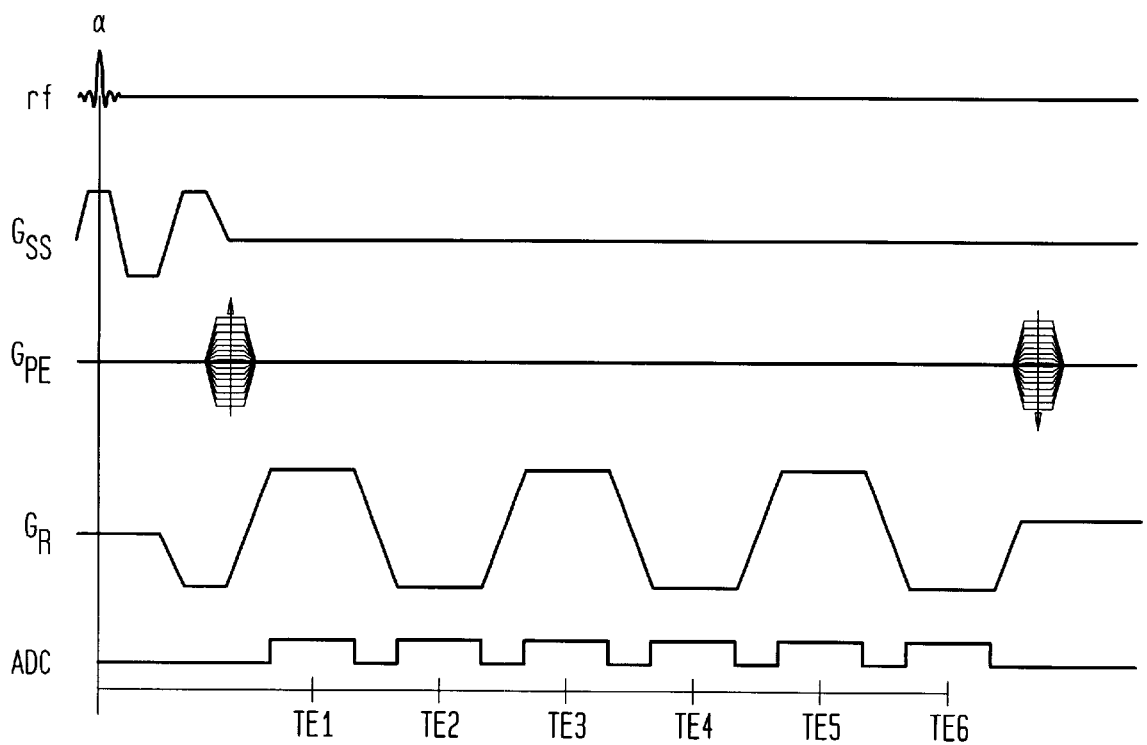
FIG. 2 shows a two-dimensional MR pulse sequence that may advantageously be used in accordance with the invention.

Alternatively, a velocity-compensated two-dimensional multi-echo sequence can be used (see FIG. 2). In this alternative, the even echoes may be velocity-compensated in the read direction and the odd echoes may be used to estimate phase from flow along the read direction (as is described below). A three echo sequence of this type (see FIG. 3) may be particularly advantageous for evaluating data where contrast agents are used and the venous signal is to be suppressed.

Figure 3:
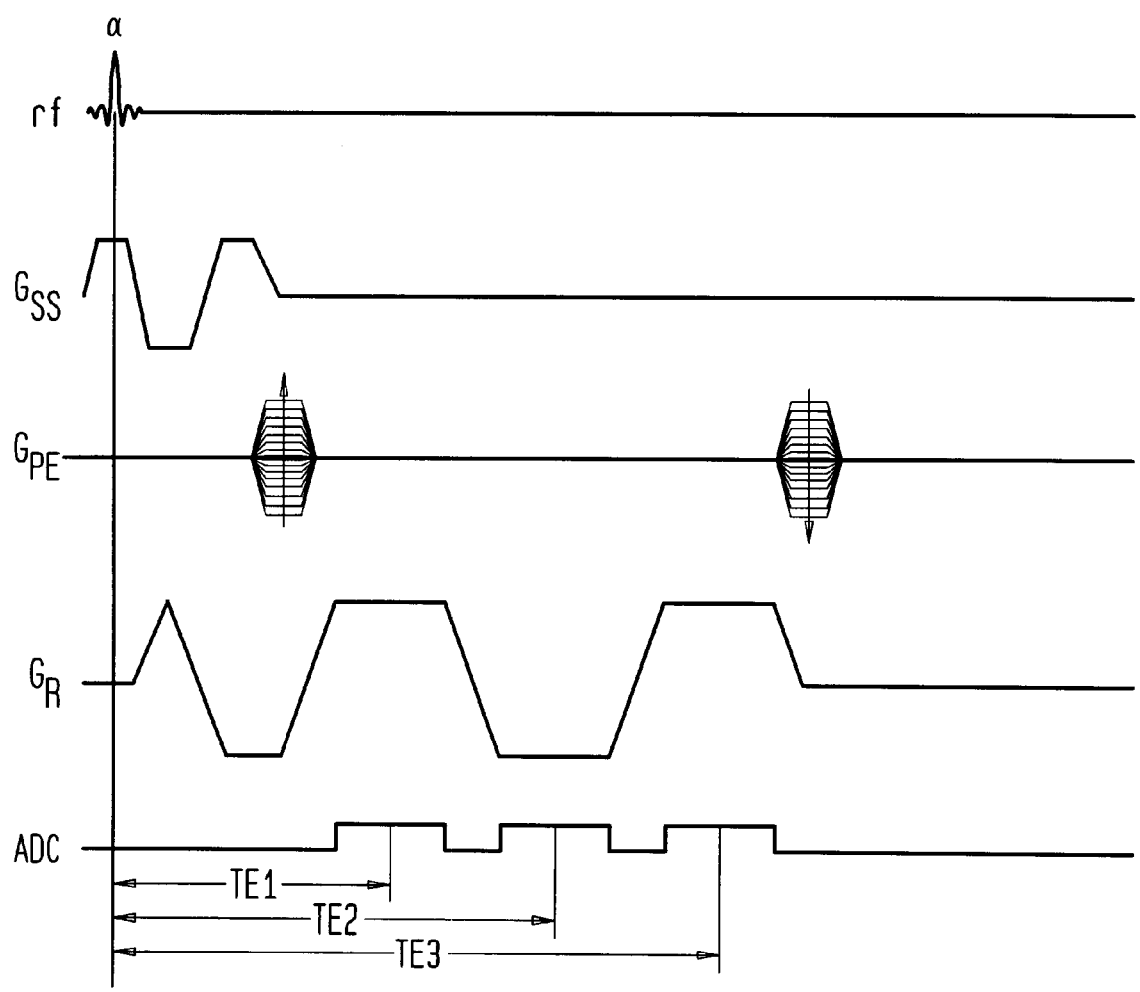
FIG. 3 shows a multi-echo two dimensional MR pulse sequence that may advantageously be used in accordance with the invention.

Although FIGS. 1, 2 and 3 illustrate MR pulse sequences of the gradient echo type, other types of sequences can be used instead. For example, echo-planar sequences (including segmented or interleaved echo-planar sequences) can be used as long as they produce gradient echos.

Where the invention is to be used for diagnostic medical applications (e.g. diagnostic medical imaging applications to form in vivo images or simply diagnostic medical applications to measure e.g. oxygen saturation or blood volume in vivo) the loss of signal from venous blood relative to the background must be observable above the noise. To bring this result about, the echo time TE must be chosen so that sufficient cancellation of the signal from venous blood occurs. Optimizing the signal from blood and the tissue surrounding it (cerebral spinal fluid, white matter, or gray matter as well) will give the best results. The resolution should be chosen to focus on the vessel size of interest. For pial veins (roughly 0.5 mm in diameter) a 1 $mm^3$ voxel volume is appropriate. At a main field strength of 1.5 T, an exemplary set of imaging parameters could e.g. include a readout time of 12 ms, a field-of-view of 256 mm by 192 mm, a slice thickness of 2 mm, 512 read points, 192 phase-encoding steps, an echo time TE of 40 ms and a repetition time TR of 60 ms. In a 16 slice MR study using these exemplary parameters, the study would be expected to last less than 3.5 minutes. If contrast agents are used, the echo time can be considerably shortened because of the enhanced signal from the blood. Likewise, if the field strength of the main magnetic field is increased, shorter echo times and shorter repetition times can be used. For example, at 3.0 T these parameters can be half of what they would be if a more conventional 1.5 T field strength were to be used. By reducing theecho and repetition times, the study would be speeded up; the extra time could be used to collect more slices, to improve the signal-to-noise ratio of the image by using more phase-encoding steps, or to reduce the time required for the study.

Figure 4A:
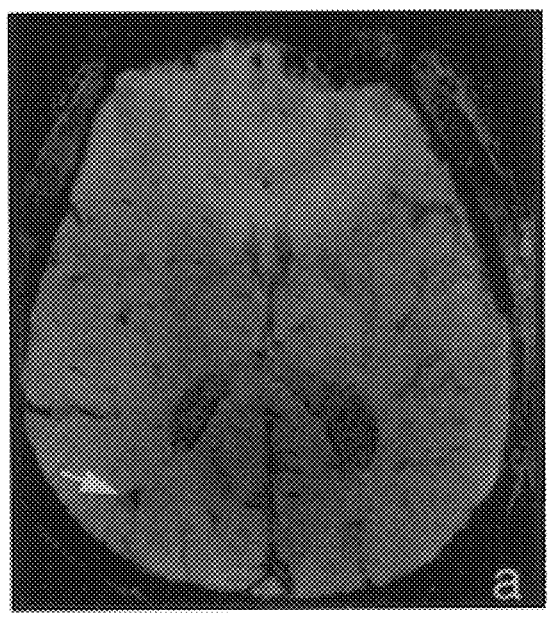
FIGS. 4a–4d show how a filtered image can be constructed.
Figure 4B:
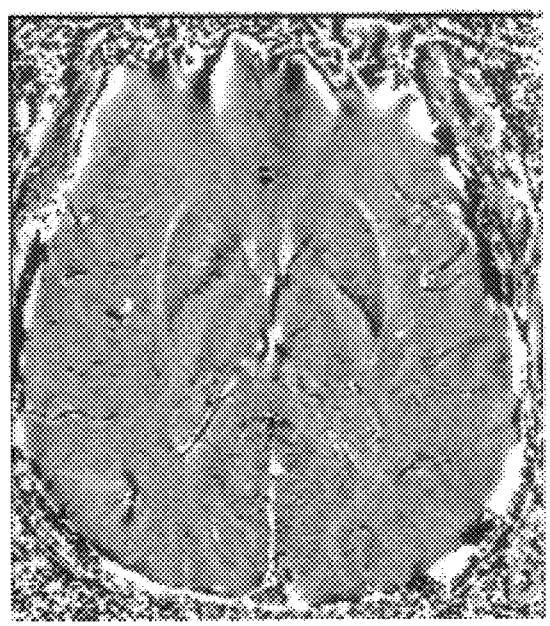
Figure 4C:
Figure 4D:
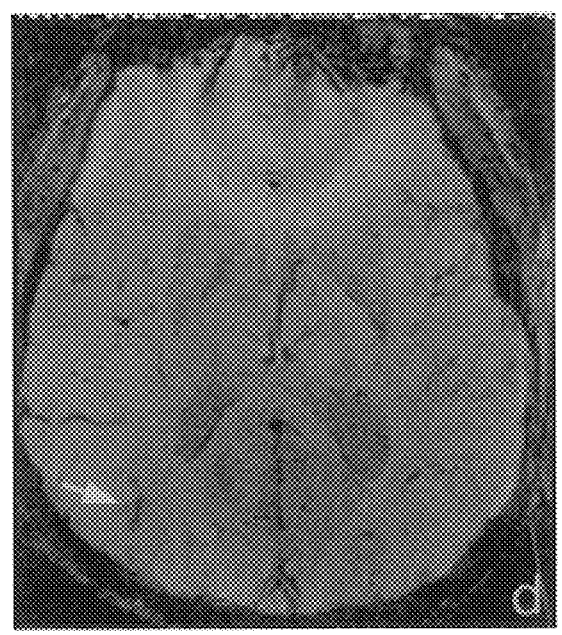

Pixels encompassing background tissue will have MR signal amplitudes that are greater than those associated with pixels having more venous blood flow. However, the difference may not be large and it may be advantageous to increase the difference by further suppressing the signal produced by venous blood. In accordance with the preferred embodiment, this can be done by forming a phase image of the region of interest and using that phase image to filter the amplitude image of that region and thereby produce a filtered image in which this difference is more pronounced. This is done by selecting a phase mask based on the following example criteria:

$$\text{if } \phi > \phi_o \text{ then } \phi_{new} = 1 \quad (4)$$

$$\text{if } \phi < \phi_o \text{ then } \phi_{new} = (\phi - \phi_o)/\pi + 1 \quad (5)$$

where
φ=the phase of a pixel encompassing venous blood
φ$_o$=the phase of a pixel encompassing background tissue
φ$_{new}$=the phase of the corresponding pixel in the phase mask If this new modified phase image is called p then the filtered image at each pixel is defined by the relation $$S_{filtered}=S_{total}*p^q \qquad (6)$$

where q represents the number of times p is multiplied against $S_{total}$. The reason q is not always unity is that phases can vary from −π to 0 and, therefore, higher q values further suppress the venous blood with this choice of filter. FIGS. 4a–4d demonstrate the entire process where a magnitude image (FIG. 4a) and a phase image (FIG. 4b) are originally constructed, a new phase filter image is created (FIG. 4c), and this phase filter is then multiplied 4 times against the magnitude image to reveal an improved effect on the modified magnitude image (FIG. 4d).

Although a preferred filter has been defined above, this is not required. Other filters can be used instead. For example, all phases lying within a range about 0° can be set to unity and those outside set to zero. In this way, if phase aliasing of the vessel occurs, it will still successfully be set to zero in the phase filter. In this example, q would be set to 1 since there would be no point in multiplying the magnitude image by the filter more than once. Alternatively, for vessels that are perpendicular to the field and that are long relative to their length, phase may be positive. In such a case, phases above zero would cause φ$_{new}$ to be set equal to 1−φ/π while phases below zero would cause φ$_{new}$ to be set equal to 1. It is alternatively possible to make the filter depend on the vessel orientation. Thus, the filtered image can be constructed to distinguish structures, depending upon their types, their orientations, or both.

The above-described filtering methodology has been applied to brain imaging (see FIGS. 4a, 4b, 4c and 4d), but is not limited thereto. For example, in the peripheral vascular system, both arteries and veins usually appear bright. To distinguish between them, it may be advantageous to use this filtering methodology after administration of a contrast agent. The multi-echo sequence (FIG. 2) or the three echo sequence (FIG. 3) can be used to obtain phase information about both deoxyhaemoglobin and flow in one direction. (The flow phase can be found independent of local field errors as will be described below.) In this way, if the flow is upward, the phase can be made negative. In this instance, as has been described above, the phase filter will suppress the venous signal.

If the application requires that the phase of the flowing blood be determined directly from the acquired MR data, this can be done by using an MR pulse sequence in which a single RF pulse induces two echoes, one being flow compensated (signal denoted by $S_{comp}$) and the other being not so compensated (signal denoted by $S_{uncomp}$). If the echo time TE2 of the second echo is twice the echo time TE1 of the first echo, then by twice complex dividing the signal from the second echo by the signal from the first echo, only the phase from the flowing blood will remain in the processed image. More generally, if the first echo time is TE1 (in this example, the first echo is assumed to be flow compensated) and the second echo time is TE2 (in this example, the second echo is assumed to be not flow compensated and TE1 is assumed to be less than TE2), then the processing will proceed as follows. Find the phase of the first image and multiply it by TE2/TE1. This creates a new first image whose signal is $$S_{new}=S_{comp}\exp(-i2\ \pi\gamma\Delta B(TE2/TE1-1)TE1) \qquad (7)$$

Dividing the second image by the new first image yields a phase dependent only on the flow, i.e., phase($S_{uncomp}/S_{new}$) depends only upon the rate of bloodflow. It should be noted that the phase of the first image must be known precisely, i.e. it should be x rather than x+2 π, x+4 π etc. (a phenomena called aliasing). Aliasing can be caused by a flow velocity exceeding a critical rate, and can be avoided by selecting a read gradient that prevents aliasing from coming about at the maximum expected velocity of the blood in the blood vessels under consideration. Advantageously, the read gradient is also chosen so that the phase of the veins flowing upward in the leg is negative. By using the phase mask algorithm described above, pixels with negative phase will be suppressed while those with positive phase (such as arteries) will not.

On occasion, there can be sources of error that are not dependent on the echo time. This implies that the phase must be written as the sum of two terms, a time independent term φ$_o$ and a time dependent term φ$_1$, i.e., φ=φ$_o$+φ$_1$, where the second term φ$_1$=γΔBTE. Using two velocity compensated echoes from the pulse sequence illustrated in FIG. 2, for example the second and fourth echoes, both φ$_o$ and φ$_1$ can be separately extracted. If the signal from these two echoes is $S_2$ and $S_4$, then the time dependent phase is now given by φ$_1$=phase($S_4/S_2$)*TE1/(TE4−TE2). Accordingly, Eq.(7) becomes:

$$S_{new}=S_{comp}\exp(-i\phi_1(TE3/TE2-1)) \qquad (8)$$

where the first signal used is now $S_{comp}$ at TE2 and the third echo is $S_{uncomp}$ at TE3. (TE3 could just as well have been TE1, which is also not flow compensated, i.e., the flow phase can be found from either the first echo or the third echo.) Either of the above described methods eliminates all field effects, including those from the vessels, in order to measure the phase from the flow. Other approaches to removing background field effects are also possible.

Figure 5:
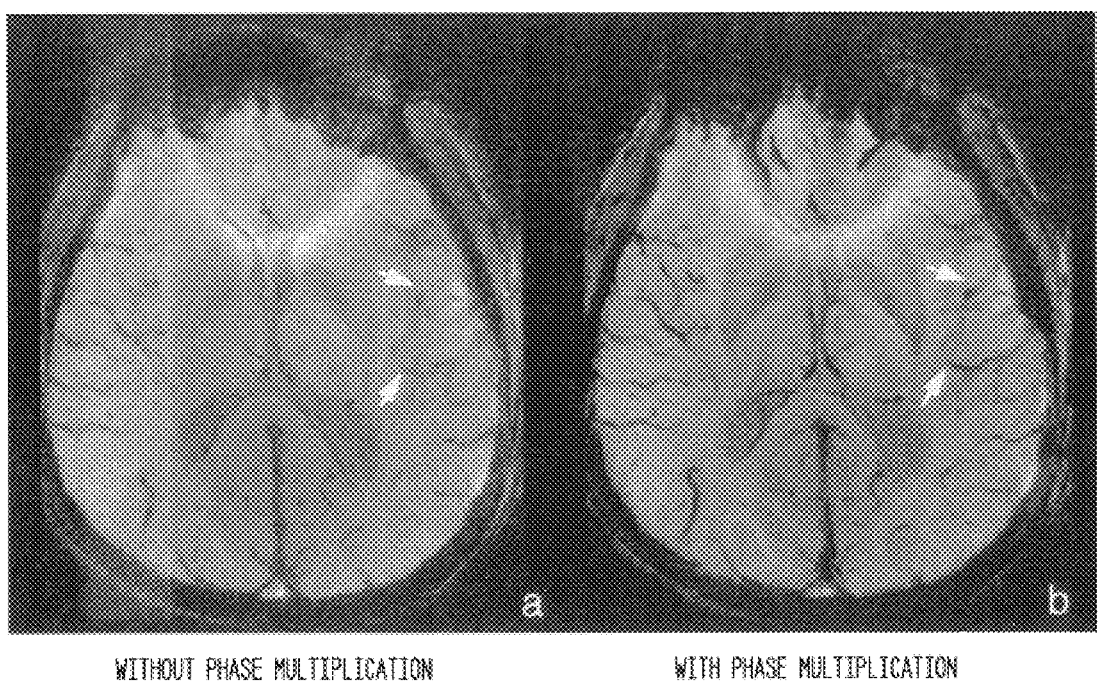
FIG. 5 shows a minimum intensity projection.
Figure 6:
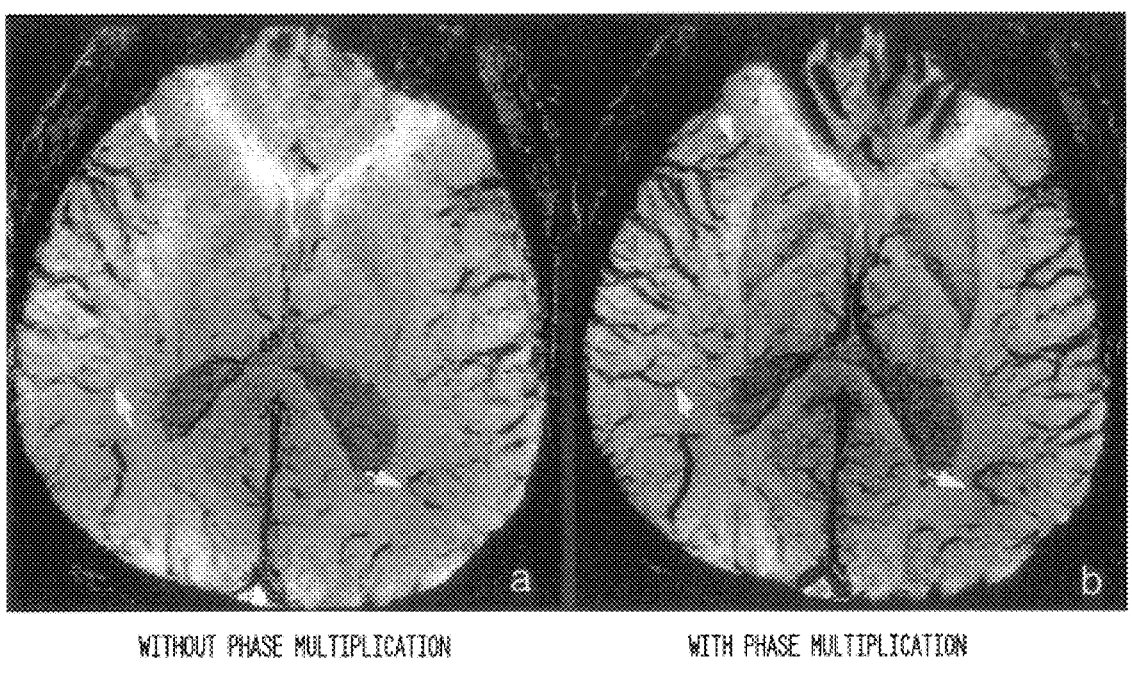
FIG. 6 shows a minimum intensity projection constructed after administration of a contrast agent to the patient.

Advantageously, the filtered image generated as described above can be subjected to a minimum intensity projection ("mIP") to visualize the veins and subjected to a maximum intensity projection ("MIP") to visualize the arteries. Taking a minimum intensity projection of the filtered images requires looking for the smallest signal along a ray passing through a stack of images (i.e., through a 3D data space). The resulting projection tends to show the vessels as dark (FIG. 5). Likewise, taking a maximum intensity projection of the filtered images requires looking for the largest signal along a ray passing through a stack of images (i.e., through a 3D data space). The resulting projection tends to show the vessels as bright (FIG. 6).

Hence, it is possible from a single scan to simultaneously visualize both arteries and veins with different contrast and to estimate total arterial and venous blood volumes. However, since the arteries shown tend to be major vessels rather than small ones, while the veins shown are both large and small, the ratio of venous blood to arterial blood will be inaccurately high. To compensate for this problem, a second scan may be carried out, in which the signal from blood is purposely dephased (as by using a bipolar gradient pre-pulse prior to the readout gradient). Since arterial bloodflow is generally fast, arterial blood is easy to dephase. Although venous bloodflow will dephase as well, such dephasing is of little consequence since the MR signal from venous bloodflow has already been suppressed as described above. By subtracting the dephased image from the rephased image, an image can be obtained that is made up exclusively of arteries. From this image, total arterial blood volume can be better estimated. Finally, the ratio of arterial blood volume to venous blood volume can be more accurately calculated.

Estimating Cerebral Blood Volume and Oxygen Saturation

Collecting a series of echoes, say every 5 ms, for example, and correcting for the background T2* by multiplying the ith echo signal by exp(TEi/T2*) yields a signal which can be processed for the background venous blood volume. To extract the blood signal $S_{blood}$ and the oxygen saturation Y from the data, a model must be assumed. For a cylinder making a known angle to the field, the oscillations in the signal as determined by equation (1) can be used to determine Y while the amplitude of the oscillations can be used to find $S_{blood}$. Therefore, the size of a vessel in a voxel can be estimated by assuming it is a cylinder, that Y is known, and that its orientation to the field is known. For more complicated models, the shape of the signal response as a function of TE will be different than that in equation (1), but the basic concept of extracting Y from the oscillatory behavior and $S_{blood}$ from the amplitude of the local maxima will remain the same. Practically, the signal from both the background and the blood will depend on the spin density of each tissue, their T2* values and their T1 values. To accurately extract the total blood volume (not Y) these values must be known. Without these values, the calculation of $S_{blood}$ only gives the signal fraction not the physical volume fraction.

Using Contrast Agents

In the methods described above, no contrast agent was used to enhance the described effect by increasing the MR signal from the blood. Indeed, it was anticipated that even conventional contrast agents might disrupt the balance between arterial and venous phase. However, experiments have demonstrated that such disruption does not occur.

The use of a T1-reducing contrast agent enhances the signal from blood vessels relative to surrounding tissue. As the blood signal increases, so too does the partial volume effect described above. For example, if $S_{blood}$ doubles then the signal loss can also double (at the appropriate value of TE). Any enhancement of the MR signal from the blood will improve the images of veins and arteries. Intravascular contrast agents have even more powerful effects because they reduce T1 even more. Exemplary images are shown in FIGS. 6a and 6b. The MR signal losses are demonstrably enhanced relative to the images without contrast agent.

The use of a contrast agent that increases the MR signal from the blood also makes it possible to improve the image quality by decreasing the echo time TE. This in turn reduces the field inhomogeneity effect while maintaining the ability to visualize the veins. The reduced echo time also means that the repetition time TR can be reduced. Consequently, the data can be collected faster or larger quantities of data can be acquired in for the same imaging time.

While one or more preferred embodiments have been described above, the scope of the invention is limited only by the following claims:

What is claimed is:

1. A method of collecting MR data from a vein-containing and background tissue-containing region of interest within a living subject, comprising the steps of:
   conducting an MR study using a velocity-compensated MR pulse sequence in which the echo time is selected to cause a partial volume signal cancellation from veins in the region of interest as compared with the background tissue in the region of interest; and
   acquiring MR data from gradient echoes produced by the MR study.

2. The method of claim 1 wherein the MR pulse sequence is a gradient echo pulse sequence.

3. The method of claim 1 wherein the MR pulse sequence is an echo-planar pulse sequence.

4. The method of claim 1, wherein the MR pulse sequence is a two-dimensional pulse sequence.

5. The method of claim 1, wherein the MR pulse sequence is a three-dimensional pulse sequence.

6. The method of claim 1, wherein the MR pulse sequence is a multi-echo pulse sequence.

7. A method of MR imaging a region of interest containing at least two structures having different magnetic susceptibilities and a background material in which said structures are embedded, comprising the steps of:
   conducting an MR study of the region of interest using a MR pulse sequence in which the echo time is selected to cause different partial volume signal cancellations from the structures as compared with the background material; and
   acquiring MR data from gradient echoes produced by the MR study.

8. A method of determining oxygen saturation of a subject's blood in vivo in a region of interest, comprising the steps of:
   conducting an MR study of said region of interest using a velocity-compensated multi-echo MR pulse sequence;
   acquiring MR data from gradient echoes produced by the MR study; and
   determining, from the acquired MR data, the oxygen saturation of the subject's blood in the region of interest utilizing an oscillatory signal loss caused by partial volume signal cancellation.

9. A method of determining venous blood volume in a vein-containing region of interest in a subject in vivo, comprising the steps of:
   conducting an MR study of said region of interest using a velocity-compensated multi-echo MR pulse sequence;
   acquiring MR data from gradient echoes produced by the MR study; and
   determining, from the acquired MR data, the venous blood volume in the region of interest.

10. A method for visualizing, in vivo, tissue-embedded reins and arteries located within a region of interest inside a subject, comprising the steps of:
    conducting an MR study using a velocity-compensated MR pulse sequence in which the echo time is selected to cause a partial volume signal cancellation from veins in the region of interest as compared with arteries and background tissue in the region of interest;
    acquiring MR data from gradient echoes produced by the MR study;
    forming an amplitude image of the region of interest from the MR data;
    forming a phase image of the region of interest from the MR data; and
    filtering the amplitude image by operating on it with the phase image and thereby producing a filtered image.

11. The method of claim 10, further comprising the step of administering a contrast agent to the subject prior to said acquisition step.

12. The method of claim 11 wherein the images are used to differentiate between two different states of oxygen saturation or blood volume.

13. The method of claim 11 in which a minimum intensity projection is used to create a projection image displaying veins and in which a maximum intensity projection is used to display arteries.

14. The method of claim 10, wherein the MR pulse sequence is a three-dimensional sequence, and further comprising the step of forming a minimum intensity projection of the filtered image.

15. The method of claim 10, wherein the MR pulse sequence is a three-dimensional sequence, and further comprising the step of forming a maximum intensity projection of the filtered image.

16. The method of claim 10, wherein the MR study is a multislice study, wherein the MR pulse sequence is a two-dimensional sequence, and further comprising the step of forming a minimum intensity projection of the filtered image.

17. The method of claim 10, wherein the MR study is a multislice study, wherein the MR pulse sequence is a two-dimensional sequence, and further comprising the step of forming a maximum intensity projection of the filtered image.

18. The method of claim 10 wherein the resolution is chosen based on the size of a vessel of interest.

19. A method of MR imaging a region of interest comprising the steps of producing an MR amplitude image of said region, producing an MR phase image of said region, and producing a filtered NR image by operating upon said amplitude image using said phase image.

20. The method of claim 19, wherein said region includes veins and arteries, and wherein the method is used to produce an image of said region from which the images of veins have been suppressed.

21. A method for visualizing a region of interest containing at least two structures having different magnetic susceptibilities and a background material in which said structures are embedded, comprising the steps of:
   conducting an MR study using a velocity-compensated MR pulse sequence in which the echo time is selected to cause a partial volume signal cancellation from one structure as compared with the other structure and background in the region of interest;
   acquiring MR data from gradient echoes produced by the MR study;
   forming an amplitude image of the region of interest from the MR data;
   forming a phase image of the region of interest from the MR data; and
   filtering the amplitude image by operating on it with the phase image and thereby producing a filtered image.

22. The method of claim 1, wherein the MR pulse sequence is a gradient echo pulse sequence.

23. The method of claim 21, wherein the MR pulse sequence is an echo-planar pulse sequence.

24. The method of claim 21, wherein the MR pulse sequence is a two-dimensional pulse sequence.

25. The method of claim 21, wherein the MR pulse sequence is a three-dimensional pulse sequence.

26. The method of claim 21, wherein the MR pulse sequence is a multi-echo pulse sequence.

27. A method of determining the susceptibility difference between tissues of interest, comprising the steps of:
   conducting an MR study of a region of interest using a velocity-compensated multi-echo MR pulse sequence;
   acquiring MR data from gradient echoes produced by the MR study; and
   determining, from the acquired MR data, the susceptibility difference between said tissues of interest utilizing an oscillatory signal loss caused by partial volume signal cancellation.

28. A method for visualizing, in vivo, tissue-embedded veins and arteries located within a region of interest inside a subject, comprising the steps of:
   conducting an MR study using a velocity-compensated MR pulse sequence in which the echo time is selected to cause a partial volume signal cancellation from veins in the region of interest as compared with arteries and background tissue in the region of interest and wherein the resolution is selected based on the size of a vessel of interest; and
   acquiring MR data from gradient echoes produced by the MR study.

29. The method of claim 28 in which a minimum intensity projection is used to create a projection image displaying veins and in which a maximum intensity projection is used to display arteries.

* * * * *